United States Patent [19]

Lindinger

[11] Patent Number: 6,129,858
[45] Date of Patent: *Oct. 10, 2000

[54] ETCHING SOLUTION

[75] Inventor: Bernd Lindinger, Presbaum/Wien, Austria

[73] Assignee: Elo-chem Atztechnik GmbH, Meersburg, Germany

[*] Notice: This patent is subject to a terminal disclaimer.

[21] Appl. No.: 07/562,745

[22] Filed: Aug. 6, 1990

[51] Int. Cl.[7] .......................... C09K 13/02; C09K 13/04; C23F 1/18; C23F 1/34
[52] U.S. Cl. ......................... 252/79.5; 252/79.2; 216/78; 216/106
[58] Field of Search ................................. 216/105, 106, 216/107, 78; 252/79.2, 79.5

[56] References Cited

U.S. PATENT DOCUMENTS 4,319,955  3/1982  Murski .................................. 216/107

FOREIGN PATENT DOCUMENTS 3305319  8/1984  Germany .
53-55474  5/1978  Japan .
2163101  2/1986  United Kingdom .

OTHER PUBLICATIONS

CAPLUS 1984:579938, 1984.
WPIDS 84–208150, 1984.
CAPLUS 1986–210622, 1986.
WPIDS 86–000100, 1986.
WPIDS 78–46595A, 1978.

*Primary Examiner*—Shean C. Wu
*Attorney, Agent, or Firm*—Brown, Martin Haller & McClain

[57] ABSTRACT

An electrolytically reclaimable etching solution for etching circuit boards and mold parts of copper and copper-based alloys, with a content of copper tetrammine sulfate, ammonia, ammonium sulfate, ammoniachloride, if necessary ammonium nitrate, and also a catalyzer for raising the etching rate. According to the invention, such an etching solution excels through a content of vanadium or a vanadium compound as a catalyzer in a concentration of 1 mg to 99 mg/l of etching solution, calculated as vanadium.

5 Claims, No Drawings

ETCHING SOLUTION

BRIEF SUMMARY OF THE INVENTION

The object of the invention is the acceleration of the rate of etching or eating away in the dissolution of copper and copper-based alloys. In particular the invention concerns the acceleration of alkaline etching agents, as they are used in the fabrication of printed circuit boards.

In the fabrication of printed circuit boards, one starts as a rule from the laminated base material. The desired conducting paths are produced by means of applying a conductive pattern to the copper upper surface as a resist pattern by means of screen printing or a photo process. The copper upper surface that is not covered by the resist is dissolved by means of an appropriate etching agent.

Another method, such as is used with two-sided circuit boards, includes imprinting the upper surface that is later to be etched away, and thereby leaving the conductor path and the through-plating free. Subsequently the strip conductors are galvanically strengthened, the borings are galvanically layered with copper, and over both a metallic resist is galvanically deposited (Sn, Sn/Pb-metal resist). Additionally, the organic resist applied at the beginning is stripped and the copper lying thereunder is dissolved by means of a suitable corrosion agent. The conducting paths and the through-platings are protected against dissolution by means of the metal resist.

In the production of one-sided circuit boards, acid etching agents are used, so that the applied metal resist technique in the fabrication of through-hole plated circuit boards necessitates the use of alkaline corrosion agents. Copper tetrammine chloride has succeeded as an optimal etching agent; while having a sufficient etching rate it shows hardly any trailing etching, it does not disturb the metal resist, and it shows a high copper absorption capacity.

Disadvantages of these known etching methods are that the copper removed through etching can only be reclaimed in small amounts, which cannot be practically undertaken by the user, and therefore the disposal of the used solution presents a problem. This can happen by means of expensive detoxification of the complex copper tetrammine chloride, or, what is easier for the user, the used solution can be recycled through the manufacturer. In the European Community alone, 6 million liters of such etching agents are transported on the streets. The danger is obvious.

The best solution to the problem is the development of all etching agent with a sulfate base, out of which the dissolved copper can be electrolytically deposited and is therefore recoverable. The etching agent can thereby be controlled between the etching process and the recycling process, and does not constitute a loss because it does not need to be replaced. The reclaimed copper can be sold at a profit.

On the other hand there is the disadvantage associated with the copper tetrammine sulfate etching agent, which, in comparison to the copper tetrammine chloride, has about a 30% slower corrosion rate, which means longer etching time and thereby lesser. production output. This deficiency can be compensated by longer etching modules or by means of inserting an accelerator which considerably raises the etching rate.

Such an accelerator is the goal of the present invention.

The etching solutions employed herein consist normally of tetrammine copper (II)-sulfate, ammonia, ammonium sulfate and ammonium chloride or of salts of corresponding ions. Etching solutions without halogenide likewise correspond to the described method. A further addition for the prevention of oxidation of Pb/Sn- or Sn-corrosion resist and for the passivity of the anode sides of the bipolar electrodes, is phosphoric acid or a dissolving phosphate. Formulations which replace a part of the sulfate with nitrate can also be accelerated according to the invention.

The known formulations described herein achieve a etching rate of from about 30 to 35 µm copper/min.

According to the invention the etching rate of such etching solutions can be catalyzed by means of exactly dosed additions of vanadium or a vanadate or another vanadium salts, so that an essential acceleration of the etching rate to about 40 to 50 µm copper/min. can be reached.

The object of the present invention is thus to provide an electrolytically reclaimable etching solution for etching circuit boards and mold parts of copper and copper-based alloys, with a content of copper tetrammine sulfate, ammonia, ammonium sulfate, ammoniachloride, if necessary ammonium nitrate, and also a catalyzer for increasing the corrosion rate. According to the invention such a all etching solution excels by means of a content of vanadium or a vanadium compound as catalyzer in a concentration of 1 mg to 99 mg/l, etching solution, calculated as vanadium.

Examples of etching solutions according to the invention are in ionic concentration per liter:

| | |
|---|---|
| --1. Solution: | 60–120 g copper |
| | 150–200 g sulfate |
| | 0.5–5 g chloride |
| | 1–99 mg vanadium or a vanadium salt, calculated as vanadium |
| 2. Solution: | 60–120 g copper |
| | 120–170 g sulfate |
| | 10–100 g nitrate |
| | 0.5–5 g chloride |
| | 1–99 mg vanadium or a vanadium salt, calculated as vanadium |
| 3. Solution: | 60–120 g copper |
| | 150–200 g sulfate |
| | 10–100 g nitrate |
| | 0.5–5 g chloride |
| | 0.5–20 g phosphate |
| | 1–99 mg vanadium or a vanadium salt, calculated as vanadium-- |

The solutions 1 to 3 contain may additional ammonia for regulating the alkaline pH value.

In a known manner the etching rate is temperature- and pH value-dependent. According to the invention, the optimal temperature of the etching solution has been identified as between 35° C. and 60° C., and the pH value as between 8.1 and 8.8.

Vanadium, or vanadium compounds as the case may be, are known as catalyzers for etching solutions on the basis of copper tetrammine sulfate (DE-A1-33 05 319). However, the known formulations found no distribution in practice since grave deficiencies attended the described etching solutions.

DE-A1-33 05 319 thus must be absolutely halogen-free, and the employed etching solution is characteristically maintained that it contains sulfate ions and is chloride-free.

Such a requirement that is known to be inconvenient is not included in the present invention.

Especially unsatisfactory however are the copper deposits obtained in the recycling processes according to DE-A1-33 05 319. On the one hand because the copperdeposits were too brittle, and on the other because they do not hang securely together, they tend to shatter, and lastly were difficult to recover from the cathode (see DE-A1-34- 29 902 and the following comparison example).

This deficiency is met with in the present invention in that the vanadium concentration is merely held in the region of 1 mg/l to 99 mg/l, so that the vanadium deposited in the copper is present only in the smallest concentration (10 μg/g) and thus causes neither a brittleness nor a shattering of the copper-cathode.

Simply presented, the etching process satisfies the following equation: $Cu^+ Cu^{++} 2 Cu^+$.

The reoxidation of the $Cu^+$ to $Cu^{++}$ occurs through atmospheric oxygen. Since the etching rate is dependent on the concentration of the $Cu^{++}$ ions, this helps determine the rate of the reoxidation, which again, dependent on the etching machines, can greatly vary (air supply, spray pressure etc.).

The invention is more clearly illustrated in the following example:

EXAMPLE

A etching solution with a content of 330 g $CuSO_4 \cdot 5H_2O$, 80 g ammonium sulfate, 4 g ammonium chloride, 90 mg $V_2O_5$ and 4 g (NH4) $2HPO_4$ per liter whose pH value is set with ammonia at 8.4, was used in a etching module with a working temperature of 50° C. for etching one-sided Cu-laminated circuit boards and through-hole plated circuit boards. In continuous operation an etching rate of about 40 μm copper/min. is achieved.

With electrolytic reclaiming, the copper is cathodically deposited and can be easily removed from the cathode as cohesive foil.

Comparison Example (corresponding to DE-A1-33 05 319). The gauge of DE-A1-33 05 319 is reworked on the basis of the "optimal composition" contained therein. This etching solution contains per liler 0.787 Mol copper tetrammine sulfate, 0.45 Mol ammonium sulfate, 0.45 Mol ammonia and 1 g ammonium monovanadate. The pH value amounted to 9.65. In etching research on copper laminated circuit plates, the etching rate cited in DE-A1-33 05 319 could essentially be achieved. In the connected electrolytic recycling of the etching solution, however, no cohesive copper deposits could be obtained; the deposited copper does not hang together, it tends to shatter and can only be poorly removed from the electrodes used for the depositing.

Further Examples:

Other etching solutions within the present invention include the following, with concentrations stated on a per liter basis:

1. 1 to 2 Mol copper
   0.01 to 0.1 Mol ammonium chloride
   0.1 to 1.3 Mol ammonium nitrate
   1.8 to 2.1 Mol ammonium sulfate
   1–99 mg vanadium or a vanadium salt, calculated as vanadium
   ammonia sufficient to set the pH value at 8.1 to 8.8.
2. 330 g $CuSO_4 \cdot 5 H_2O$
   80 g ammonium sulfate
   4 g ammonium chloride
   4 g $(NH_4)_2HPO_4$
   90 mg $V_2O_5$
   ammonia sufficient to set the pH value at 8.4.
3. 1 to 2 Mol copper
   0.01 to 0.1 Mol ammonium chloride
   0.1 to 1.3 Mol ammonium nitrate
   1.8 to 2.1 Mol ammonium sulfate
   0.1 to 20 g phosphate in the form of phosphoric acid or a phosphoric acid salt
   1–99 mg vanadium or a vanadium salt, calculated as vanadium
   ammonia sufficient to set the pH value at 8.1 to 8.8.
4. 330 g $CuSO_4 \cdot 5 H_2O$
   80 g ammonium sulfate
   4 g ammonium chloride
   4 g $(NH_4)_2HPO_4$
   0.1 to 20 g phosphate in the form of phosphoric acid or a phosphoric acid salt
   90 mg $V_2O_5$
   ammonia sufficient to set the pH value at 8.4

I claim:

1. Electrolytically reclaimable etching solution for etching circuit boards and mold parts of copper and copper-based alloys including at least one compound selected from the group consisting of copper tetrammine sulfate, ammonia, ammonium sulfate, ammonium chloride, and ammonium nitrate, and a catalyzer for raising the etching rate, said catalyzer comprising vanadium or a vanadium compound in a concentration of 1 mg to 99 mg/l of etching solution, calculated as vanadium.

2. Etching solution according to claim 1 comprising, per liter, 1 to 2 Mol copper, 0.01 to 0.1 Mol ammonium chloride, 0.1 to 1.3 Mol ammonium nitrate, 1.8 to 2.1 Mol ammonium sulfate plus a sufficient amount of ammonia to set the pH value at 8.1 to 8.8.

3. Etching solution according to claim 1 or 2 comprising, per liter, 330 g $CuSO_4 \cdot 5H_2O$, 80 g ammonium sulfate, 4 g ammonium chloride, 4 g $(NH_4)_2HPO_4$, 90 mg $V_2O_5$ and a sufficient amount of ammonia to set the pH value at 8.4.

4. Etching solution according to one of claims 1 or 2 comprising, per liter, 0.1 to 20 g phosphate in the form of phosphoric acid or a phosphoric acid salt.

5. Etching solution according to claim 3 comprising, per liter, 0.1 to 20 g phosphate in the form of phosphoric acid or a phosphoric acid salt.

\* \* \* \* \*